US011838708B2

(12) United States Patent
    Albers

(10) Patent No.: US 11,838,708 B2
(45) Date of Patent: Dec. 5, 2023

(54) NON-PLANAR INGRESS PROTECTION ELEMENT FOR A SENSOR DEVICE

(71) Applicant: Knowles Electronics, LLC, Itasca, IL (US)

(72) Inventor: John J Albers, Chicago, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 233 days.

(21) Appl. No.: 17/602,091

(22) PCT Filed: Apr. 3, 2020

(86) PCT No.: PCT/US2020/026734
§ 371 (c)(1),
(2) Date: Oct. 7, 2021

(87) PCT Pub. No.: WO2020/210134
PCT Pub. Date: Oct. 15, 2020

(65) Prior Publication Data
US 2022/0150609 A1    May 12, 2022

Related U.S. Application Data

(60) Provisional application No. 62/832,175, filed on Apr. 10, 2019.

(51) Int. Cl.
    *H04R 1/02*    (2006.01)
    *B81B 7/00*    (2006.01)

(52) U.S. Cl.
    CPC ............. *H04R 1/02* (2013.01); *B81B 7/0032* (2013.01); *B81B 2201/0271* (2013.01); *B81B 2203/019* (2013.01); *H04R 2201/003* (2013.01)

(58) Field of Classification Search
    CPC .... H04R 1/02; H04R 2201/003; B81B 7/0032
    (Continued)

(56) References Cited

U.S. PATENT DOCUMENTS

2014/0044297 A1    2/2014  Loeppert et al.
2017/0137282 A1    5/2017  Sooriakumar et al.
2018/0147041 A1*   5/2018  Chouinard .......... A61M 25/104

FOREIGN PATENT DOCUMENTS

EP        3457709 A1    3/2019
JP        2010011340 A  1/2010
WO        2017027242 A1 2/2017

OTHER PUBLICATIONS

International Search Report, PCT/US2020/026734, Date of actual completion of the international search Jul. 23, 2020, dated Jul. 31, 2020.

(Continued)

*Primary Examiner* — George C Monikang
(74) *Attorney, Agent, or Firm* — FLENER IP & BUSINESS LAW; Zareefa B. Flener

(57) ABSTRACT

A sensor device includes a substrate, a microelectromechanical systems (MEMS) transducer disposed on the substrate, in integrated circuit, and a cover disposed on the substrate. The sensor device includes a port or an opening for allowing acoustic energy to be incident on the MEMS transducer. The sensor device further includes an ingress protection element positioned to cover the port, the ingress protection element comprising at least one non-planar portion.

22 Claims, 13 Drawing Sheets

(58) Field of Classification Search
USPC .................................................. 381/111–115
See application file for complete search history.

(56) References Cited

OTHER PUBLICATIONS

PCT Written Opinion of the International Searching Authority, PCT/US2020/026734, posted to Patentscope Oct. 15, 2020.

* cited by examiner

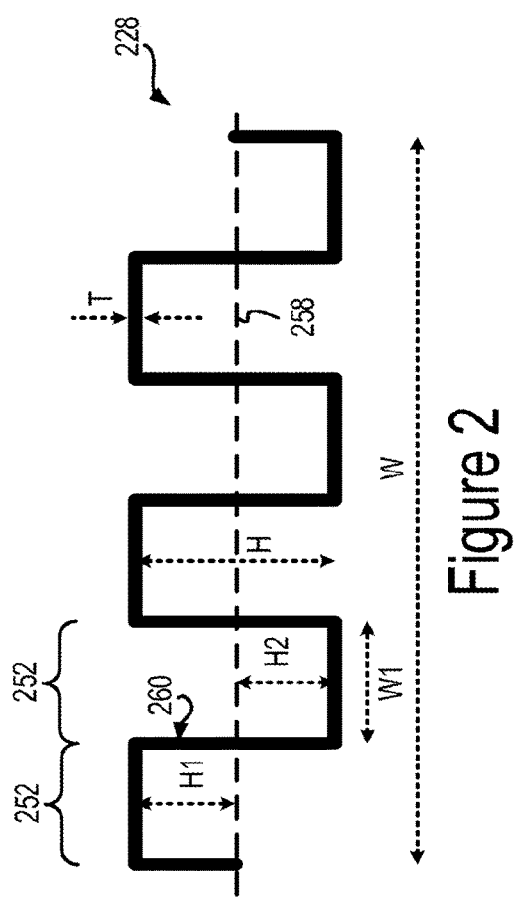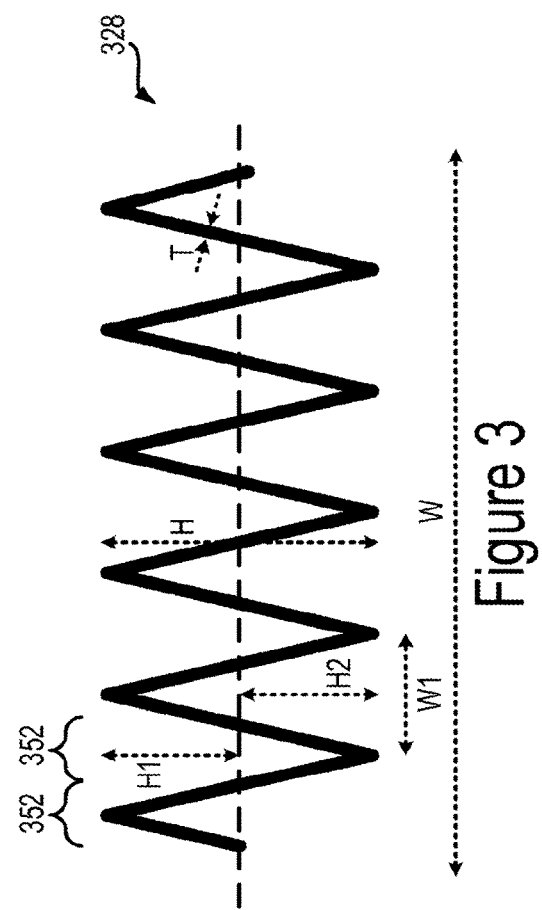

NON-PLANAR INGRESS PROTECTION ELEMENT FOR A SENSOR DEVICE

CROSS-REFERENCE TO RELATED APPLICATIONS

This application claims the benefit of and priority to U.S. Provisional Patent Application No. 62/832,175, filed Apr. 10, 2019, the entire contents of which are incorporated herein by reference.

BACKGROUND

In a microelectromechanical system (MEMS) sensor a MEMS die includes at least one diaphragm and at least one back plate. The MEMS die is supported by a base or substrate and enclosed by a housing (e.g., a cup or cover with walls). A port may extend through the substrate (for a bottom port device) or through the top of the housing (for a top port device). Sound energy traverses through the port, moves the diaphragm, and creates a changing electrical potential of the back plate, which creates an electrical signal. Sensors are deployed in various types of devices such as personal computers, cellular phones, mobile devices, headsets, and hearing aid devices.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIGS. 2-4 illustrate various examples shapes of the ingress protection element shown in FIG. 1.

Figure 1:
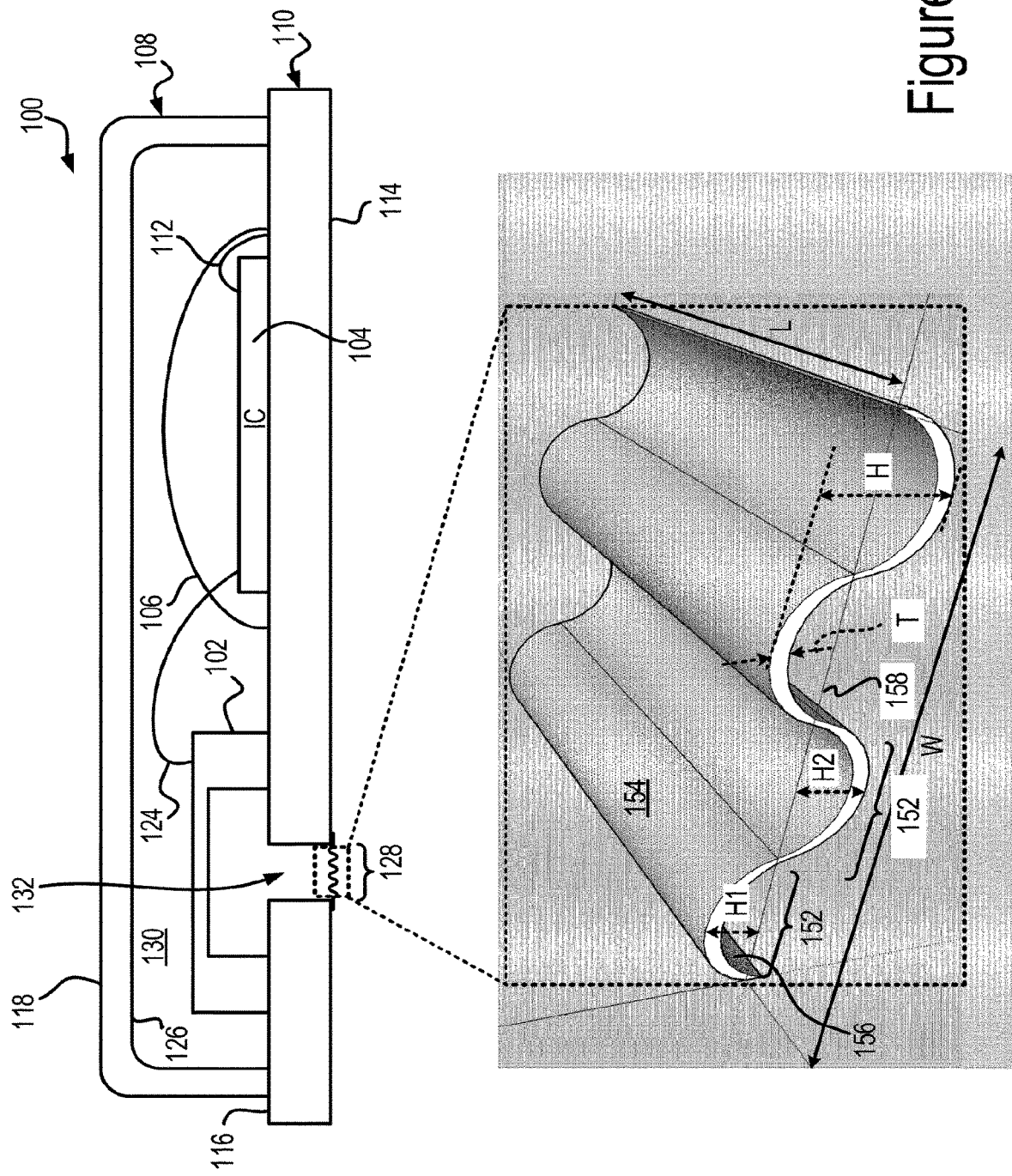
FIG. 1 shows a cross-sectional view of an example sensor device.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The present disclosure describes devices and techniques for improving the robustness of sensor devices, such as those incorporating microelectromechanical systems (MEMS) transducers. In particular, the devices and techniques described in the present disclosure improve the resistance of a sensor package to ingress by contaminants, such as, for example, solid particles and liquids. In some implementations, the present disclosure may provide for improved resistance to contaminant ingression with little or no impact to the signal-to-noise ratio (SNR) of the sensor device.

In one or more embodiments, the sensor package can include a port through which sound energy can enter the sensor package and be incident on a MEMS transducer. The port can be covered with a non-planar ingress protection element that is acoustically permeable, but obstructs the passage of contaminants from entering the sensor package. The ingress protection element can include one or more ridges, that result in an increased surface area to provide low acoustic impedance, and thereby, a reduced impact on the SNR of the sensor device.

In one or more embodiments, the sensor package can include a shim assembly that is coupled to the sensor package. The non-planar ingress protection element is coupled to the shim assembly such that the non-planar ingress protection element covers the port. The shim assembly can position the ingress protection element at a distance from the substrate or a cover in which the port is formed.

In some embodiments, the ingress protection material is a mesh material. In some implementations, the mesh can be disposed on an external or outer surface of the sensor package. For example, the mesh can be disposed within an indented region of an external or outer surface of the sensor package, which additionally allows the mesh to have a relatively large surface area and thereby have a low acoustic impedance. As acoustic impedance can affect the SNR of the sensor device, the low acoustic impedance of the mesh may have substantially no impact on the SNR of the sensor device. The structures disclosed herein can be used to implement sensor devices such as audio sensor devices or microphone devices. The structures disclosed herein can also be used in related sensors, such as pressure sensors, sensors designed to detect non-audible frequencies such as ultrasonic, and multi-functional sensors that include the ability to detect pressure, gas, humidity or temperature.

In some embodiments, the bottom port is defined in a substrate of the sensor device. The substrate can include an indented region on a back surface of the substrate and around the bottom port. The non-planar ingress protection element can be disposed within the indented region to cover the bottom port. The indented region can have a depth that is greater than an extent of the ingress protection element from a base of the indented region. In some embodiments, the indented region can have a depth that is substantially the same as the extent of the ingress protection element from the base of the indented region, such that a surface of the ingress protection element is approximately flush with a bottom surface of the substrate.

FIG. 1 shows a cross-sectional view of an example sensor device 100 according to an embodiment of the present disclosure. The first example sensor device 100 includes a substrate 110, a microelectromechanical systems (MEMS) transducer 102, an integrated circuit (IC) 104, and a cover 108. The substrate 110 includes a first surface ("front surface") 116 and an opposing second surface ("back surface") 114. The MEMS transducer 102 and the IC 104 are disposed on the front surface 116 of the substrate 110. A first set of wires 124 electrically connect the MEMS transducer 102 to the IC 104, and a second set of wires 112 connect the IC 104 to interconnects (not shown) on the front surface 116 of the substrate 110. The MEMS transducer 102, the IC 104, and the substrate 110 can each include conductive bonding pads to which ends of the wires can be bonded. In some embodiments, wires 124 can be bonded to the appropriate bonding pads using a solder. Optionally, in some embodiments an encapsulating material 106 can at least partially (or in some instances completely) cover the IC 104 and the second set of wires 112. By covering the IC 104 and the second set of wires 112 within the encapsulating material 106, an effect of radio frequency signals, generated by the IC 104 and the second set of wires 125, on the MEMS transducer 102 and other components mounted on the substrate 110 can be reduced. The cover 108 encloses the MEMS transducer 102, the IC 104, the first set of wires 124, and the second set of wires 125, and defines a back volume 130 of the sensor device 100. In some implementations, at least a portion of the IC 104 can be embedded into the substrate 110. For example, the front surface 116 of the substrate 110 can include a cavity, and the IC 104 can be disposed within the cavity. In some implementations, the cavity can be deeper than a height of the IC 104, such that a top surface of the IC 104 lies below the plane of the front surface 116. In some other implementations, the depth of the cavity can be such that the top surface of the IC 104 lies above the plane of the front surface 116 of the substrate 110. The substrate 110 can include, without limitation, a printed circuit board, a semiconductor substrate, or a combination thereof.

The substrate 110 can define a bottom port 132 that extends between the first surface 116 and the second surface 114 of the substrate 110. The bottom port 132 is positioned below the MEMS transducer 102 and provides an acoustic channel between the MEMS transducer 102 and the outside of the sensor device 100. The bottom port 132 can have a circular, elliptical, or a polygonal (regular or irregular) shape in a plane that is parallel to the front surface 116.

An opening of the bottom port 132 can be covered with an ingress protection element 128. The ingress protection element 128 can be acoustically permeable. That is, the ingress protection element 128 can allow sound energy from outside of the sensor device 100 to enter the bottom port 132 and be incident on the MEMS transducer 102. The acoustic permeability of the ingress protection element 128 can be high, such that the presence of the ingress protection element 128 does not substantially affect the SNR of the sensor device 100. The ingress protection element 128 includes a non-planar structure. For example, as shown in the expanded portion of FIG. 1, the ingress protection element 128 includes one or more non-planar portions 152. The non-planar portions 152 can be protrusions or depressions in the ingress protection element 128 such that a surface 154 of the ingress protection element 128 does not lie in a single plane. The ingress protection element 128 can have a thickness T that can be measured between the surface 154 and an opposing surface 156 of the ingress protection element 128. In some examples, the thickness T of the ingress protection element 128 can be uniform throughout the surface 154 of the ingress protection element 128. In some instances, the thickness T can be non-uniform. In some examples, the non-planar portions 152 can have a height (e.g., H1 and H2) that is greater than a thickness T of the ingress protection element 128. As an example, the height (e.g., H1 and H2) can be measured with respect to a reference plane 158 that includes a longitudinal axis of the ingress protection element 128. In some instances, the reference plane 158 can be centered along a total height of the ingress protection element 128. In some such instances, the height H1 of one non-planar portion 152 measured in one direction with respect to the reference plane 158 can be equal to the height H2 of another non-planar portion 152 measured in an opposite direction with respect to the reference plane 158. In some instances, the reference plane 158 can lie anywhere along the total height H of the ingress protection element 128. The ingress protection element 128 can also have a length L and a width W. In some examples, the length L and the width W can be a function of the dimensions of the bottom port 132. For example, in some instances, the length L and the width W of the ingress protection element 128 can be greater than the corresponding dimensions of the opening of the bottom port 132, such that the ingress protection element 128 can completely cover the opening. In some examples, the ingress protection element 128 can have a height H between 20 microns and 80 microns, can have a length L and a width W between 150 microns to 450 microns, and can have a thickness T between 10 microns to 20 microns. In some instances, the ingress protection element 128 can be coupled to the second surface 114 of the substrate by an adhesive or epoxy. In some instances, the cross-section of the ingress protection element 128 can have a sinusoidal shape. In particular, one or more non-planar structures can have a sinusoidal shape. In some examples, at least a portion of the periphery of the ingress protection element 128 can include a planar portion that can couple with the sensor device 100.

In some implementations, the ingress protection element 128 can be formed of a netting, network, or interlace of a material, which can include, without limitation, a metal, a polymer (such as, for example, a polyamide), a polyester, polytetrafluoroethylene (PTFE), a composite, or a combination thereof. In some implementations, the ingress protection element 128 can include openings that can range from values less than 1 micron to about 7 microns in size. In some implementations, the material used to form the ingress protection element 128 can have hydrophobic properties, to prevent liquids from entering through the bottom port 132. For example, the ingress protection element 128 can include Teflon, or Teflon-like materials to impart hydrophobic properties. In some implementations, a porous membrane can be utilized instead of, or in addition to, the ingress protection element 128, where the membrane can have pores with sizes that are similar to those discussed above in relation to the ingress protection element 128. In addition, the membrane can be made of materials similar to those discussed above in relation to the ingress protection element 128.

In some examples, the ingress protection element 128 can be formed flat, and then be shaped to include non-planar portions 152 by applying a tensile stress with a press-mold, for example, to impart the shape of the mold to the ingress protection element. In some instances, the ingress protection element 128 can be pre-fabricated with the non-planar portions 152. In some instances, the non-planar portions 152 in the ingress protection element 128 can be formed by bending a flat ingress protection element at various portions.

The ingress protection element 128 can be coupled to the second surface 114 of the substrate 110 using an adhesive device or compound. In some implementations, an epoxy can be used to bond the ingress protection element 128 to the substrate 110. In some other implementations, a die-attach can be used to bond the ingress protection element 128 to the substrate 110. In some implementations, a double sided adhesive film or tape can be used to bond the ingress protection element 128 to the substrate 110. The ingress protection element 128 can be placed on the substrate 110 using a pick-and-place system or a bonder. The adhesive can be applied to substrate 110, to the ingress protection element 128 or both substrate 110 and the ingress protection element 128 before the ingress protection element 128 is placed on the substrate 110. The ingress protection element 128 can be removable and replaceable, such that once removed the ingress protection element 128 can be replaced with another ingress protection element or filtering material, irrespective of the manner in which the ingress protection element 128 is attached to the substrate 110. The ingress protection element 128 can be pulled and removed from over the substrate 110 when sufficient force is applied using appropriate tools, such as, for example, pick-and-place tools.

The ingress protection element 128 can have low acoustic impedance resulting from the increased surface area provided by the non-planar portions 152. The equivalent acoustic resistance of the ingress protection element 128 of the sensor device 100 depends on a variety of factors. Assuming the ingress protection element 128 is a mesh screen, the equivalent resistance in part depends upon the size of the mesh screen and area of the acoustic opening. The impedance for one opening (or hole) in the mesh screen is:

$$Z_a = R_a - j\omega M_a$$

$$\text{Where: } R_a = \rho_0 \pi r^2 \sqrt{2\omega\mu}\left[\frac{t}{r} + 2\left(1 - \frac{A_h}{A_b}\right)\right]$$

$$\text{And: } M_a = \frac{\rho_0}{\pi r^2}\left[t + 1.7r\left(1 - \frac{r}{b}\right)\right]$$

Where: $\rho_0$ is the density of air, r is the opening radius, b is the distance between holes, t is the thickness of mesh, $A_h$ is the area of the opening, and $A_b$ is the area of non-opening per hole cell. The equations above describe one acoustic impedance pathway modeled as an RL series circuit. Noise from the mesh screen is dominated by the lossy resistance pathway $R_a$ and $M_a$. The total acoustic impedance of the mesh is the sum of all pathways. The non-planar nature of the ingress protection element 128 increases the total surface area of the ingress protection element, which, in turn, increases the total number of acoustic impedance pathways. An increase in the total number of acoustic impedance pathways decreases the overall acoustic impedance of the ingress protection element 128. Thus, low acoustic impedance, or high acoustic permeability, can be achieved in a small footprint by including non-planar portions in the ingress protection element 128.

Figure 4:
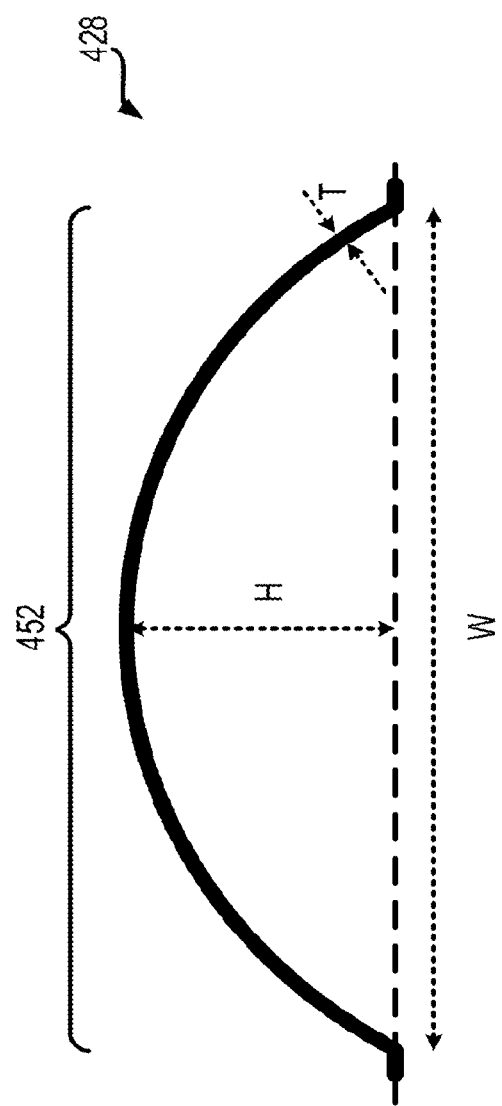

FIGS. 2-4 illustrate various example shapes of the ingress protection element 128 shown in FIG. 1. In particular, FIGS. 2-4 show cross-sectional views of the example ingress protection element shapes that can be utilized to implement the ingress protection element discussed herein. FIG. 2 shows an ingress protection element 228 having rectangular shaped non-planar portions 252. For example, a first non-planar portion 152 can have a height H1 that is measured in relation to a reference plane 258 and a second non-planar portion 252 can have a height H2 that is also measured in relation to the reference plane 258. The reference plane 258 can be similar to the reference plane 158 discussed above in relation to the ingress protection element 128 shown in FIG. 1. In some examples, H1 can be equal to H2. In some examples, a total height H of the ingress protection element 228 can be measured between the extremities of the ingress protection element 228, and can, be a sum of the heights H1 and H2. The heights H1, H2, and H are greater than the thickness T of the ingress protection element 228. Each non-planar portion 252 can have a width W1, and the entire width of the ingress protection element 228 can be represented by W. In some instances, each non-planar portion 252 can have the same dimensions (height, width, and thickness). In some instances, at least one non-planar portion can have at least one dimension that is different from the corresponding dimension of another non-planar portion. The non-planar portions 252 can individually include surfaces 260 that are planar, however, such surfaces 260 are non-planar with respect to at least one other surface of the ingress protection element 228. The planar surfaces 260 can also be non-planar with respect to the reference plane 258 that includes a longitudinal axis of the ingress protection element 228.

The ingress protection element 328 shown in FIG. 3 includes triangular shaped non-planar portions 352, and the ingress protection element 428 shown in FIG. 4 shows a dome shaped non-planar portion 452. While only one dome shaped non-planar portion 452 is shown in FIG. 4, the ingress protection element 428 can include multiple dome shaped non-planar portions 452 of uniform or non-uniform dimensions. Each of the non-planar portions discussed above in relation to FIGS. 1-4 increases the surface area of its respective ingress protection element. This allows, as mentioned above, a reduction in the acoustic impedance of the ingress protection element while at the same time protecting the MEMS transducer 102 from ingression of contaminants. The values of the dimensions of the ingress protection elements shown in FIGS. 2-4 can be similar to the values of the corresponding dimensions of the ingress protection element 128 discussed above in relation to FIG. 1.

Figure 5:
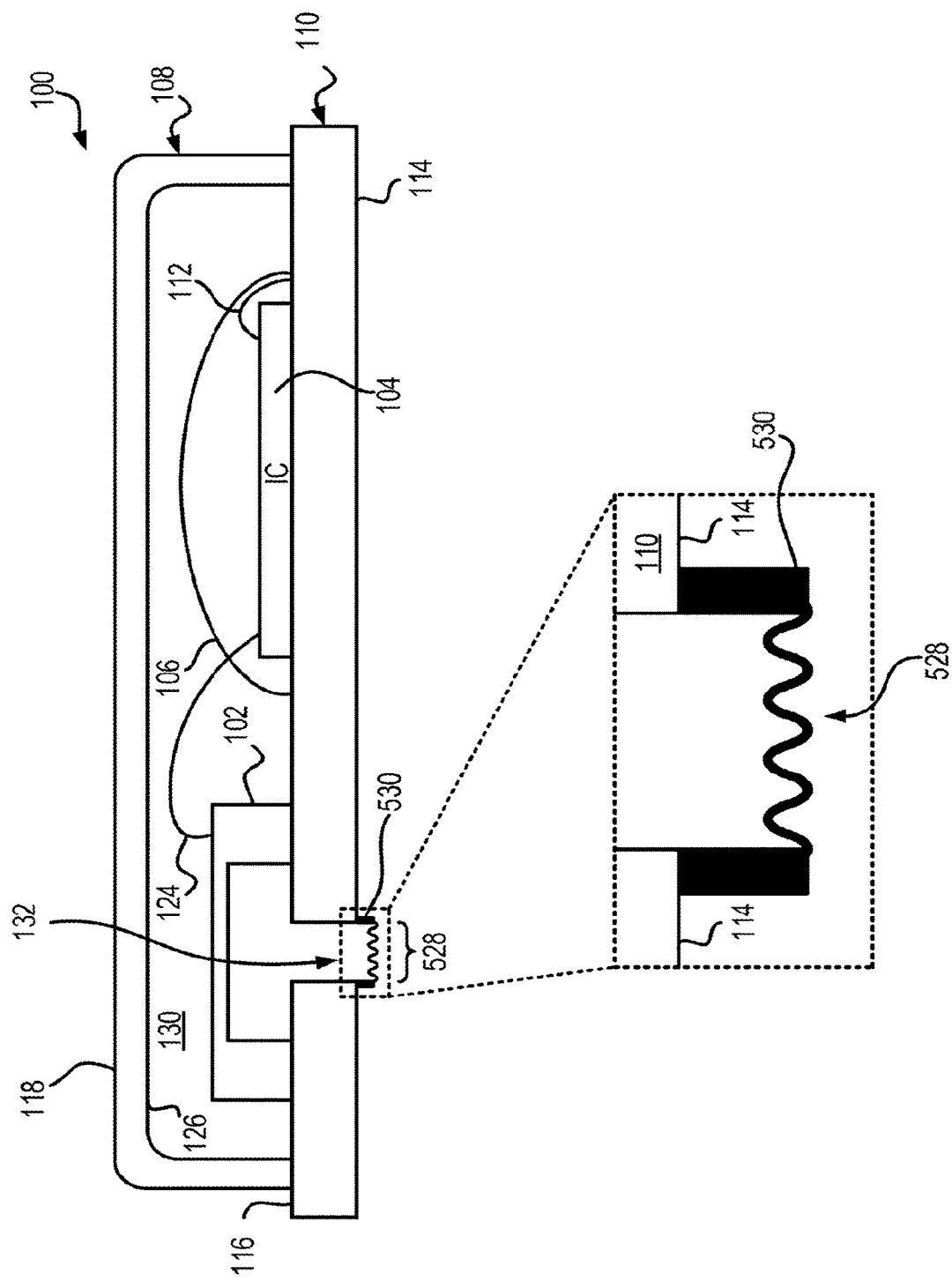
FIG. 5 shows a cross-sectional view of the sensor device having an ingress protection element with a shim assembly.
Figure 6:
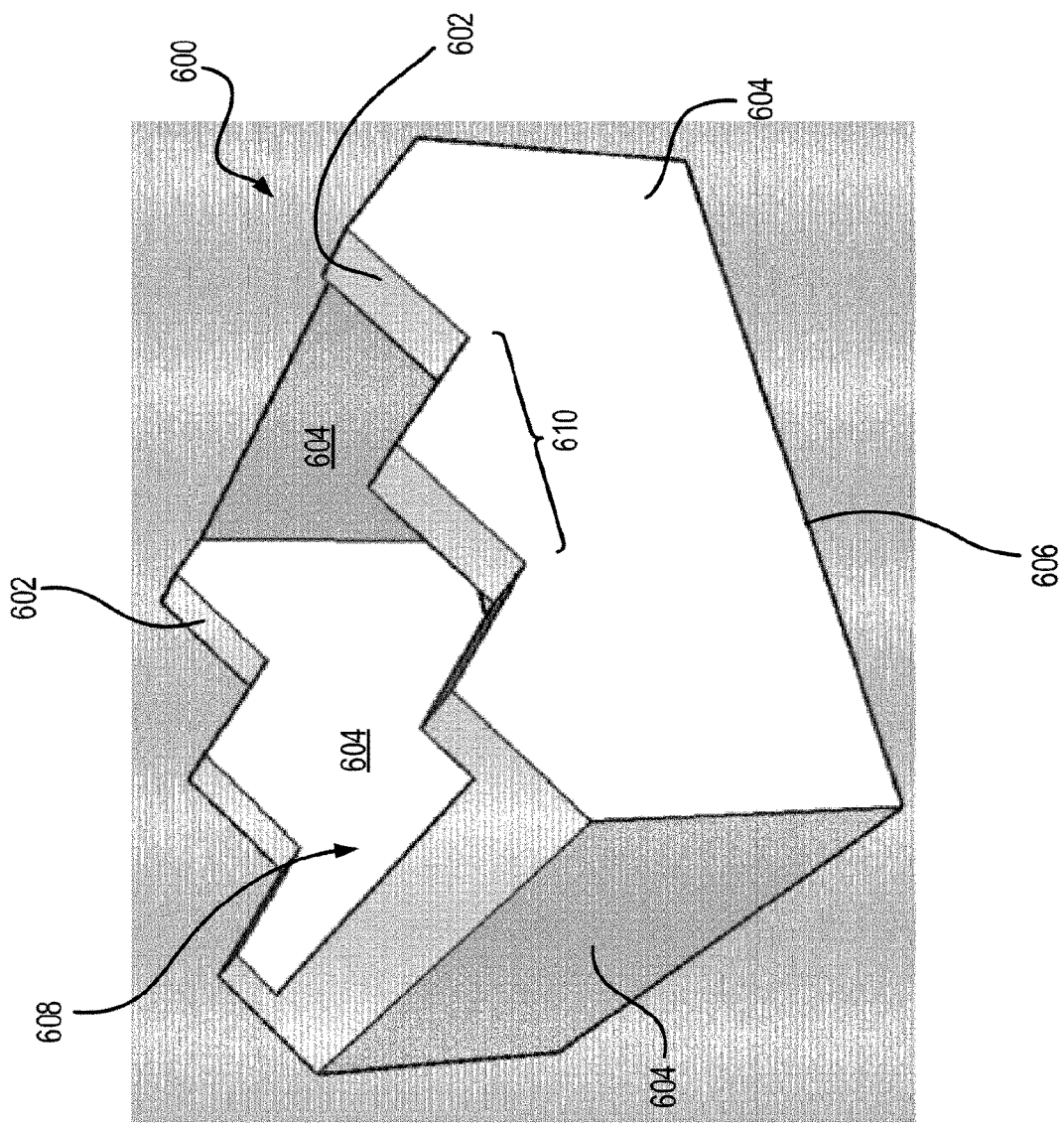
FIG. 6 shows an example shim assembly that can be utilized to implement the shim assembly shown in FIG. 5.

FIG. 5 shows a cross-sectional view of the sensor device 100 having an ingress protection element 528 with a shim assembly 530. The ingress protection element 528 can be implemented using any one of the ingress protection elements discussed above in relation to FIGS. 1-4. The shim assembly 530 can support and bond the ingress protection element 528 to the substrate 110. The shim assembly 530 can be a hollow structure that can expose the ingress protection element 528 to the port 132. That is, the shim assembly 530 can be acoustically transparent, or can have an acoustic impedance that is less than that of the ingress protection element 528. FIG. 6 shows an example shim assembly 600 that can be utilized to implement the shim assembly 530 shown in FIG. 5. The shim assembly 600 may be constructed of an epoxy, includes four walls 604, and forms a volume or cavity 608. The volume or cavity 608 can be part a front volume of the sensor device 100. The shim assembly 600 can also include a top surface 602 and a bottom surface 606. The bottom surface 606 can be bonded with the substrate 110, while the top surface 602 can be bonded with the ingress protection element 528. The top surface 602 can define at least one non-planar portion 610 that can complement a shape of the corresponding non-planar portion (e.g., 152, FIG. 1) of the ingress protection element. The complimentary non-planar shape of the at least one non-planar portion 610 of the shim assembly 600 can allow for improved bonding between the ingress protection element and the shim assembly 600. In some examples, the shim assembly 530 can be grown, deposited, or otherwise assembled as a wafer. In some other examples, the shim assembly 530 can be formed of other materials such as, for example, metal (e.g., aluminum, steel, etc.), silicon, a polymer (such as, for example, a polyamide), a polyester, Polytetrafluoroethylene (PTFE), a composite, or a combination thereof.

Figure 7:
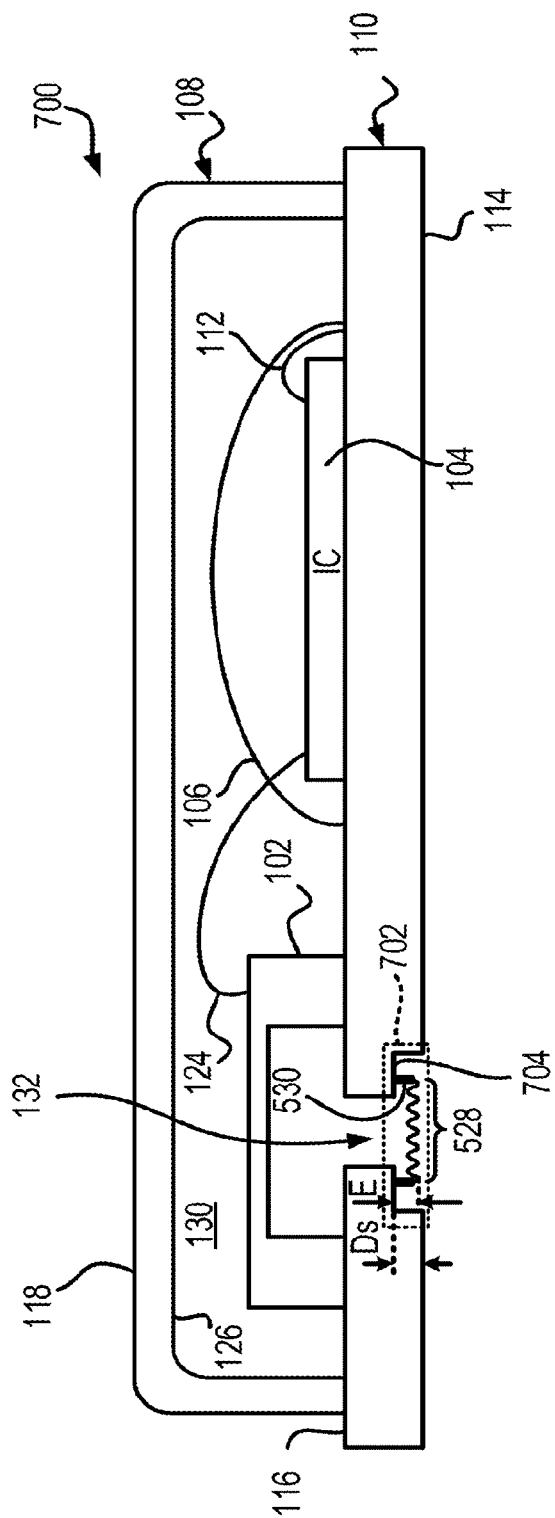
FIG. 7 shows an example sensor device including an ingress protection element positioned in an indented substrate region.

FIG. 7 shows another example sensor device 700 including an indented substrate region 702. The substrate 110 can define an indented region 702 on the back surface 114 of the substrate 110 around at least a portion of the bottom port 132. The indented region 702 can include an indented surface 704 that is offset from the back surface 114, such that a distance Ds (or the depth of the indented region 702) between the indented surface 704 and the front surface 116 is less than a distance between the back surface 114 and the front surface 116. The substrate 110 also defines the bottom port 132 that extends between the indented surface 704 and the front surface 116. In some instances, the depth Ds of the indented region 702 can be greater than the extent E of the ingress protection element 528 from the indented surface 704, where the extent E refers to a maximum height of the ingress protection element in relation to the indented surface measured normal to the indented surface. This can allow protecting the ingress protection element 528 from contact with host surface when the second surface 114 of the substrate 110 is mounted on a host. In some instances, the distance Ds can be equal to the extent of the ingress protection element 528 from the indented surface 704 such that the ingress protection element 528 is flush with the second surface 114 of the substrate 110.

Figure 8:
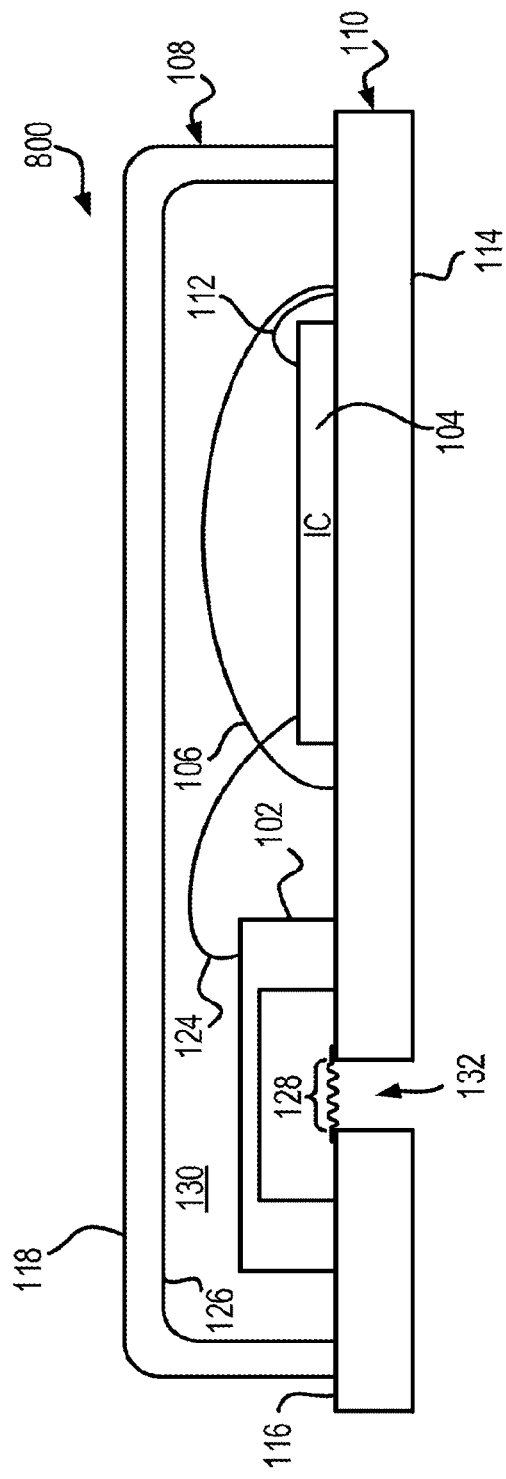
FIG. 8 shows an example sensor device including an ingress protection element mounted on the same surface as a MEMS transducer.

FIG. 8 shows an example sensor device 800 including an ingress protection element 128 mounted on the same surface as the MEMS transducer 102. This is in contrast with the sensor device 100 shown in FIG. 1, in which the ingress protection element 128 is mounted on the second surface 114, which is opposite to the first surface 116 on which the MEMS transducer 102 is mounted. The ingress protection element 128 can be implemented using any of the ingress protection elements discussed above, such as, for example, the ingress protection elements discussed in relation to FIGS. 1-4. Positioning the ingress protection element 128 on the opening of the port that faces the MEMS transducer 102 can protect the ingress protection element 128 from the risk of damage that may occur if the ingress protection element 128 were mounted on the second surface 114, or an indented region (702 shown in FIG. 7) of the second surface 114.

Figure 9:
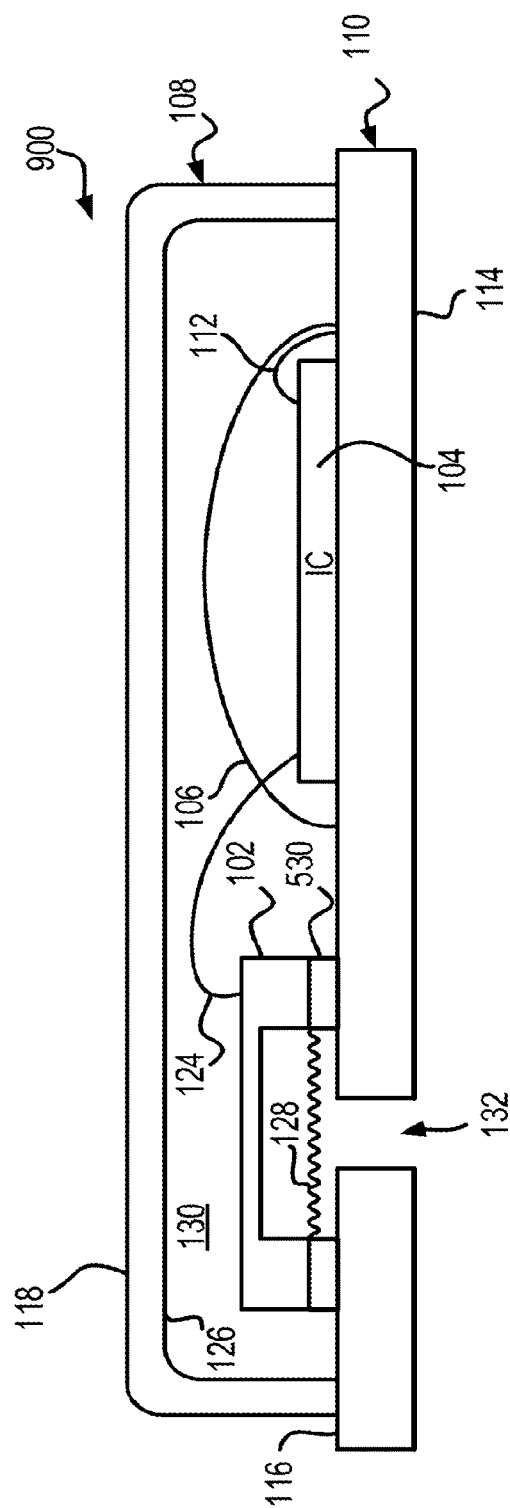
FIG. 9 shows an example sensor device including an ingress protection element and a shim assembly positioned between the MEMS transducer and the substrate.

FIG. 9 shows an example sensor device 900 including an ingress protection element 128 and a shim assembly 530 positioned between the MEMS transducer 102 and the substrate 110. The shim assembly 530 can be positioned on the first surface 116 of the substrate. The ingress protection element 128 can be positioned on top of the shim assembly (e.g., over the top surface 602 of the shim assembly 600 shown in FIG. 6), and the MEMS transducer 102 is positioned over the ingress protection element 128 and the shim assembly 530. The combined structure of the MEMS transducer 102, the ingress protection element 128 and the shim assembly 530 can be acoustically sealed. That is, there is no acoustic leakage between the connection points or areas of these elements. The positioning of the ingress protection element 128 and the shim assembly 530 under the MEMS transducer 102 can allow the use of an ingress protection element 128 that has a relatively large surface area than that of an ingress protection element positioned directly over the bottom port 132 and sized in relation to the size of the opening of the bottom port 132. As discussed above, increasing the surface area of the ingress protection element can reduce the acoustic impedance of the ingress protection element. Thus, the combination of the non-planar portions and the increased size of the ingress protection element 128 can reduce the acoustic impedance of the ingress protection element 128 while still providing protection to the MEMS transducer 102 from particulate matter.

Figure 10:
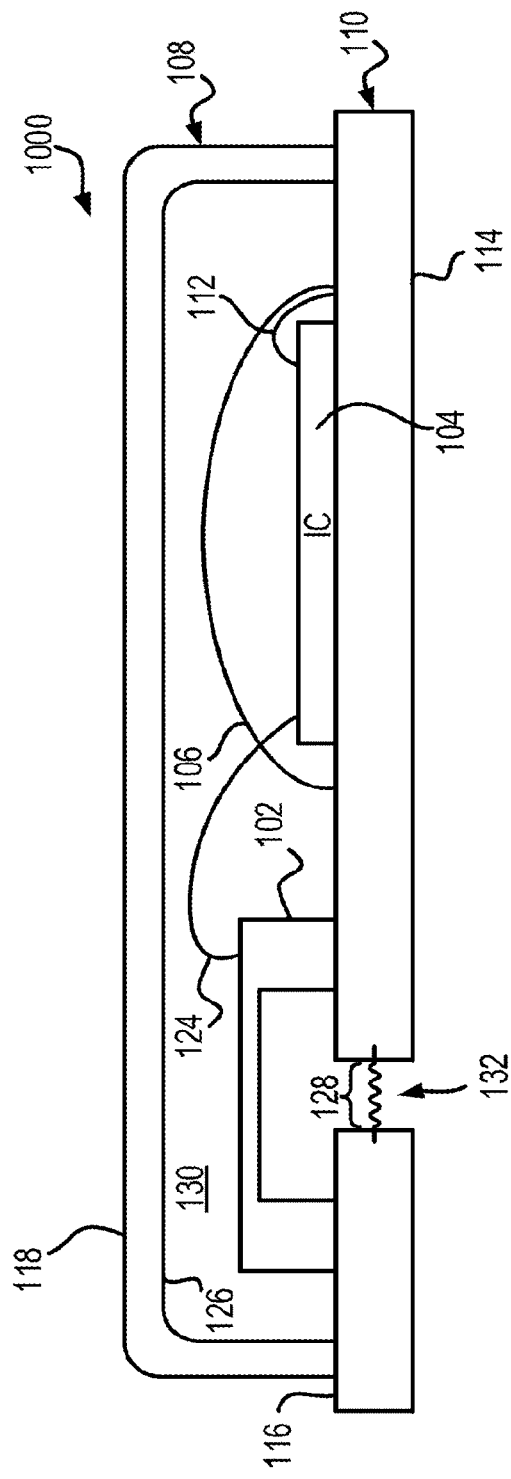
FIG. 10 shows an example sensor device including an ingress protection element that is embedded in the substrate.

FIG. 10 shows an example sensor device 1000 including an ingress protection element 128 that is embedded in the substrate 110. In particular, the ingress protection element 128 is positioned to cover the bottom port 132 but is positioned between the first surface 116 and the second surface 114 of the substrate 110. In some examples, the substrate 110 can include multiple layers. During manufacture, the ingress protection element 128 can be deposited over the bottom port 132 after the formation of a sub-layer of the substrate 110. Thereafter, one or more additional sublayers of the substrate 110 can be deposited over the periphery of the ingress protection element 128, thereby embedding the ingress protection element 128 partially within the substrate 110 and covering the bottom port 132.

Figure 11:
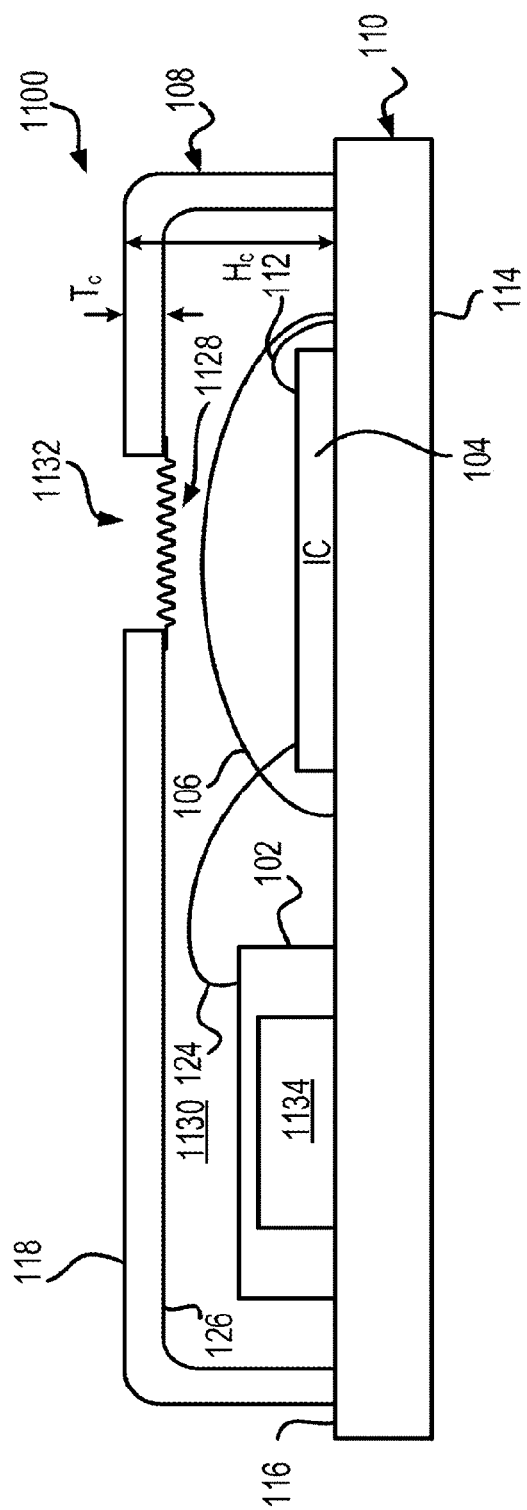
FIG. 11 shows an example sensor device including in ingress protection element positioned inside a cover of the sensor device.

FIG. 11 shows an example sensor device 1100 including an ingress protection element 1128 positioned inside a cover of the sensor device 1100. The sensor device 1100 includes an acoustic port in the cover 108 instead of on the substrate 110 (as shown in FIG. 1, for example). The cover 108 can have a height Hc and a thickness Tc. The cover 108 can define a top port 1132 that extends between a first surface 126 and a second surface 118 of the cover 108. The first surface 126 can be internal to the sensor device 1100, while the second surface 118 can be external to the sensor device 1100. The first surface 126, the substrate 110, the MEMS transducer 102, the encapsulant 106 and other components of the can, in part, define a front volume 1130. A portion of the MEMS transducer 102 that covers the first surface 116 of the substrate 110 can define a back volume 1134 of the sensor device 1110. The ingress protection element 1128 can be implemented using one or more ingress protection elements discussed above in relation to FIGS. 1-4. The ingress protection element 1128 can be mounted on the inside of the cover 108 and covers the top port 1132. That is, the ingress protection element 1128 can be coupled to the first surface 126 of the cover. Mounting the ingress protection element 1128 on the inside of the cover 108 can provide protection to the ingress protection element 1128 from external elements. In some examples, the ingress protection element 1128 can be mounted on a shim assembly, similar to the shim assemblies 530 and 600 discussed above in relation to FIGS. 5 and 6. For example, a shim assembly can be positioned between the ingress protection element 1128 and the first surface 126 of the cover 108.

Figure 12:
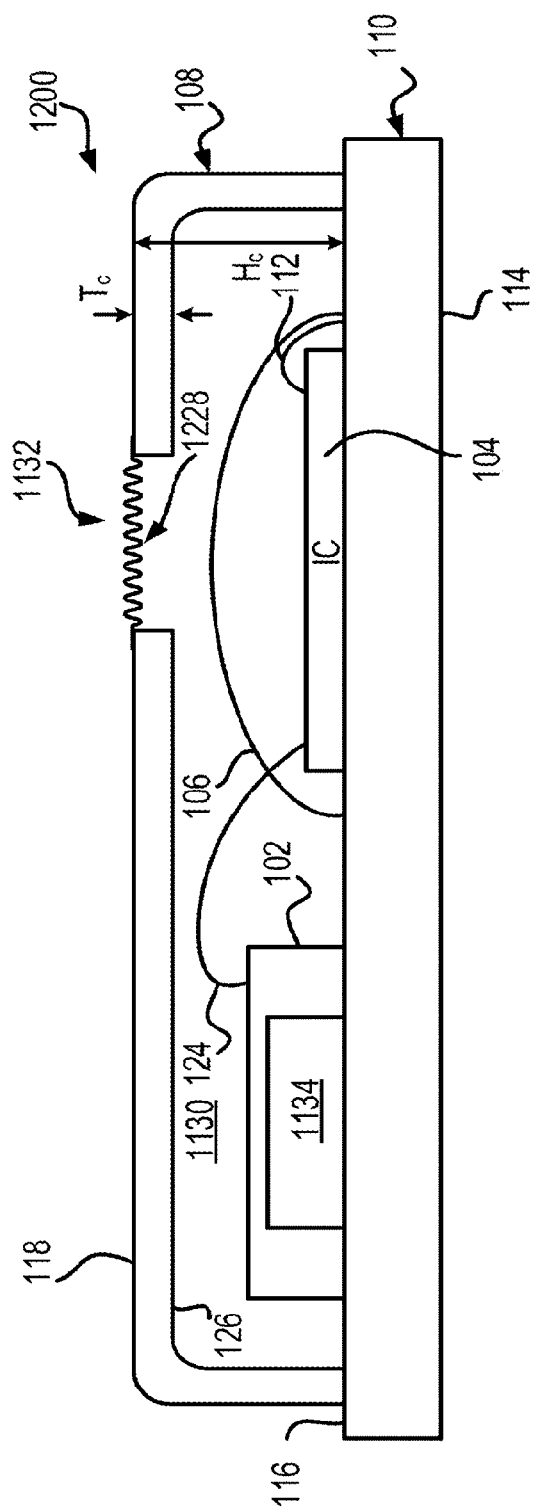
FIG. 12 shows an example sensor device including an ingress protection element positioned on an outside of the cover of the sensor device.

FIG. 12 shows an example sensor device 1200 including an ingress protection element 1228 positioned on an outside of the cover of the sensor device 1200. The sensor device 1200 shown in FIG. 12 is similar to the top port sensor device 1100 shown in FIG. 11. However, in the sensor device 1200 shown in FIG. 12, the ingress protection element 1228 is mounted on the outside of the cover 108 and over the top port 1132. In some instances, the space under the cover 108 inside the sensor device 1200 can be limited. In some such examples, the ingress protection element 1228 can be mounted on the outside of the cover 108 instead. The ingress protection elements discussed above in relation to FIGS. 1-4 can be utilized to implement the ingress protection element 1228. In some examples, the ingress protection element 1228 can be mounted on a shim assembly, similar to the shim assemblies 530 and 600 discussed above in relation to FIGS. 5 and 6. For example, a shim assembly can be positioned between the ingress protection element 1228 and the second surface 118 of the cover 108.

Figure 13:
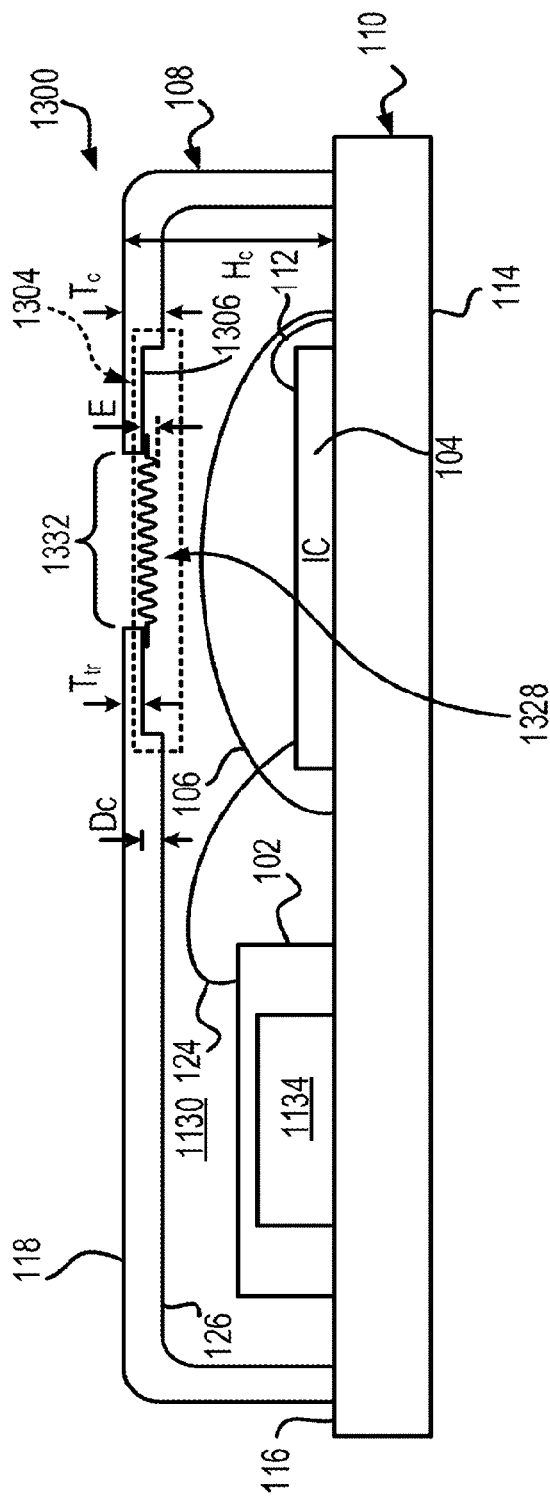
FIG. 13 shows an example sensor device including an ingress protection element positioned in an indented region on an inner surface of the cover.

FIG. 13 shows an example sensor device 1300 including an ingress protection element positioned in an indented region on an inner surface of the cover 108. In particular, the cover 108 includes an indented inner or first surface 126 that defines an indented region 1304 around at least a portion of a periphery of a top port 1332. The indented region 1304 can include an indented surface 1306 that is offset from the first surface 126 such that a distance Ttr (or the thickness of the indented region 1304) is less than the thickness Tc of the cover 108. The top port 1332 extends between the outer or second surface 118 of the cover 108 and the indented first surface 1306 of the cover 108. The indented region 1304 defines a depth Dc that refers to a distance between the first surface 126 and the indented surface 1306. In some instances, the depth Dc can be less than the thickness Tc of the cover 108. The ingress protection element 1328 can be positioned over the inner indented surface 1306 and the top port 1332. In some instances, the depth Dc of the inner indented region 1304 can be greater than an extent E of the ingress protection element 1328 from the inner indented surface 1306. Positioning the ingress protection element 1328 inside the indented region 1304 can allow additional space to accommodate the ingress protection element 1328 without having to put constraints on other components of the sensor device 1300. In some instances, a shim assembly, similar to the shim assembly 530 and 600 discussed above in relation to FIGS. 5 and 6 can be positioned between the ingress protection element 1328 and the indented surface 1306. In some such examples, the depth Dc of the indented region 1304 can be greater than the extent E of the ingress protection element 1328 with the shim assembly positioned between the ingress protection element 1328 and the indented surface 1306.

Figure 14:
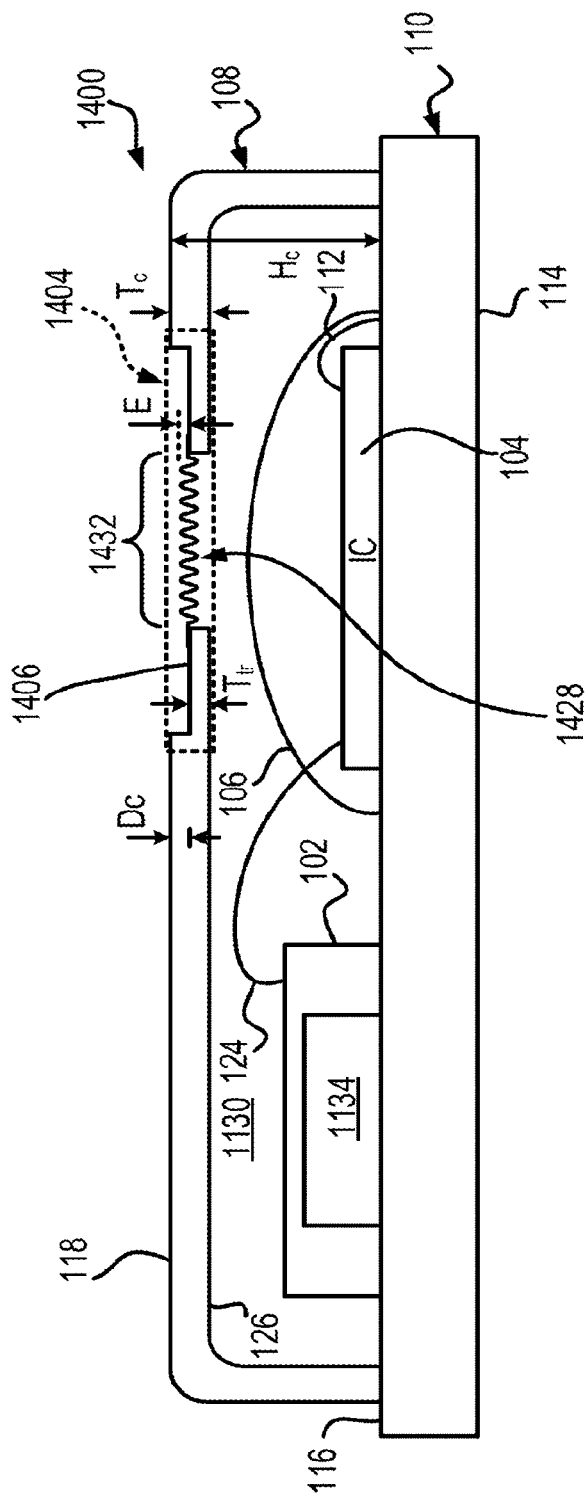
FIG. 14 shows an example sensor device including an ingress protection element positioned in an indented region on an outer surface of the cover.

FIG. 14 shows an example sensor device 1400 including an ingress protection element positioned in an indented region on an outer surface of the cover 108. In particular, the cover 108 includes an indented second or outer surface 118 that defines an indented region 1404 around at least a portion of a periphery of a top port 1432. The indented region 1404 can include an outer indented surface 1406 that is offset from the second surface 118 such that a distance Ttr (or the thickness of the indented region 1404) is less than the thickness Tc of the cover 108. The top port 1432 extends between the first or inner surface 126 of the cover 108 and the indented second or outer surface 1406 of the cover 108. The indented region 1404 can define a depth that refers to a distance Dc between the second surface 118 and the indented surface 1406. In some instances, the depth Dc can be less than the thickness Tc of the cover 108. The ingress protection element 1428 can be positioned over the outer indented surface 1406 and the top port 1432. In some instances, the depth Dc of the outer indented region 1404 can be greater than an extent E of the ingress protection element 1428 from the outer indented surface 1406. Positioning the ingress protection element 1428 inside the indented region 1406 can provide protection to the ingress protection element 1428. In some instances, a shim assembly, similar to the shim assembly 530 and 600 discussed above in relation to FIGS. 5 and 6 can be positioned between the ingress protection element 1428 and the indented surface 1406. In some such examples, the depth of the indented region 1404 can be greater than the extent of the ingress protection element 1428 with the shim assembly positioned between the ingress protection element 1428 and the indented surface 1406.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A sensor comprising:
   a substrate having a first surface and an opposing second surface, the substrate defining a port that extends between the first surface and the second surface;
   a microelectromechanical systems (MEMS) transducer disposed on the first surface of the substrate over the port;
   in integrated circuit (IC);
   a cover disposed on the substrate covering the MEMS transducer and the IC; and
   an ingress protection element positioned to cover the port, the ingress protection element comprising a third surface facing an environment outside the sensor, a fourth opposite facing surface, a perimeter of the third surface, and a thickness defined between the third and fourth surfaces, wherein the perimeter lies within a plane, and at least a portion of the third surface does not lie within the plane.

2. The sensor of claim 1, wherein the ingress protection element is disposed on the second surface of the substrate.

3. The sensor of claim 1, wherein the ingress protection element is disposed on the first surface of the substrate.

4. The sensor of claim 1, wherein at least a portion of the ingress protection element is embedded into the substrate between the first surface and the second surface of the substrate.

5. The sensor of claim 1, further comprising a shim assembly disposed on the substrate, the shim assembly having a plurality of walls that form a hollow interior cavity, the shim assembly having a top surface and a bottom surface, the bottom surface being coupled to the substrate; wherein the ingress protection element is coupled to the top surface of the shim assembly.

6. The sensor of claim 1, wherein the second surface of the substrate includes an indented region around at least a portion of a periphery of the port, and wherein the ingress protection element is disposed on the indented region.

7. The sensor of claim 1, wherein a distance measured between the portion of the third surface and the plane is greater than the thickness of the ingress protection element.

8. The sensor of claim 1, wherein a cross-section of the third surface has a sinusoidal shape.

9. The sensor of claim 1, wherein a cross-section of the third surface has a rectangular shape.

10. The sensor of claim 1, wherein a cross-section of the third surface has a triangular shape.

11. The sensor of claim 1, wherein a cross-section of the third surface includes a curvilinear domed shape.

12. A sensor comprising:
a substrate;
a microelectromechanical systems (MEMS) transducer;
an integrated circuit (IC);
a cover disposed on the substrate covering the MEMS transducer and the IC, the cover having a first surface and a second surface, the cover defining a port that extends between the first surface and the second surface; and
an ingress protection element positioned to cover the port, the ingress protection element comprising a third surface facing an environment outside the sensor, a fourth opposite facing surface, a perimeter of the third surface, and a thickness defined between the third and fourth surfaces, wherein the perimeter lies within a plane, and at least a portion of the third surface does not lie within the plane.

13. The sensor of claim 12, wherein the ingress protection element is disposed on the second surface of the cover.

14. The sensor of claim 12, wherein the ingress protection element is disposed on the first surface of the cover.

15. The sensor of claim 12, further comprising a shim assembly disposed on the cover, the shim assembly having a plurality of walls that form a hollow interior cavity, the shim assembly having a top surface and a bottom surface, the bottom surface being coupled to the cover; wherein the ingress protection element is coupled to the top surface of the shim assembly.

16. The sensor of claim 12, wherein the first surface of the cover defines at least a portion of a front volume of the sensor, wherein the first surface of the cover includes an indented region around at least a portion of a periphery of the port, and wherein the ingress protection element is disposed on the indented region of the first surface of the cover.

17. The sensor of claim 12, wherein the first surface of the cover defines at least a portion of a front volume of the sensor, wherein the second surface of the cover opposite the first surface of the cover includes an indented region around at least a portion of a periphery of the port, and wherein the ingress protection element is disposed on the indented region of the second surface of the cover.

18. The sensor of claim 12, wherein a distance measured between the portion of the third surface and the plane is greater than the thickness of the ingress protection element.

19. The sensor of claim 12, wherein a cross-section of the third surface has a sinusoidal shape.

20. The sensor of claim 12, wherein a cross-section of the third surface has a rectangular shape.

21. The sensor of claim 12, wherein a cross-section of the third surface has a triangular shape.

22. The sensor of claim 12, wherein a cross-section of the third surface includes a curvilinear domed shape.

* * * * *